(12) United States Patent
Cho et al.

(10) Patent No.: US 9,330,793 B2
(45) Date of Patent: May 3, 2016

(54) MEMORY DEVICE

(71) Applicant: SK hynix Inc., Gyeonggi-do (KR)

(72) Inventors: Seon-Ki Cho, Gyeonggi-do (KR);
Yong-Ho Kong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/556,859

(22) Filed: Dec. 1, 2014

(65) Prior Publication Data

US 2015/0332790 A1  Nov. 19, 2015

(30) Foreign Application Priority Data

May 13, 2014 (KR) .......................... 10-2014-0057149

(51) Int. Cl.
*G11C 29/00* (2006.01)
*G11C 29/44* (2006.01)

(52) U.S. Cl.
CPC ............... *G11C 29/78* (2013.01); *G11C 29/44* (2013.01); *G11C 29/76* (2013.01)

(58) Field of Classification Search
USPC ..................................... 365/200, 201, 189.12
See application file for complete search history.

(56) References Cited

U.S. PATENT DOCUMENTS

| | | | |
|---|---|---|---|
| 6,667,902 B2 | 12/2003 | Peng | |
| 6,777,757 B2 | 8/2004 | Peng et al. | |
| 6,940,751 B2 | 9/2005 | Peng et al. | |
| 7,173,851 B1 | 2/2007 | Callahan et al. | |
| 7,269,047 B1 | 9/2007 | Fong et al. | |
| 7,434,152 B2 | 10/2008 | Naso | |
| 2003/0085731 A1* | 5/2003 | Iwase | G01R 31/31701 326/16 |
| 2003/0106000 A1* | 6/2003 | Song | G11C 29/40 714/718 |

FOREIGN PATENT DOCUMENTS

KR   1020040100205   12/2004

* cited by examiner

*Primary Examiner* — Vu Le
(74) *Attorney, Agent, or Firm* — IP & T Group LLP

(57) ABSTRACT

A memory device includes a first memory block, a second memory block, a reception circuit configured to receiving a repair address and compression information, and a nonvolatile memory circuit including a first region for repairing the first memory block and a second region for repairing the second memory block, and configured to program the repair address in both the first region and the second region when the compression information represents high compression and program the repair address in either the first region or the second region when the compression information represents low compression.

12 Claims, 4 Drawing Sheets

MEMORY DEVICE

CROSS-REFERENCE TO RELATED APPLICATIONS

The present application claims priority of Korean Patent Application No. 10-2014-0057149, filed on May 13, 2014, which is incorporated herein by reference in its entirety.

BACKGROUND

1. Field

Exemplary embodiments of the present invention relate to a memory device, and more particularly, to a repair operation of the memory device.

2. Description of the Related Art

FIG. 1 is a diagram explaining a repair operation in a conventional memory device (for example, a DRAM).

A memory device may include a plurality of memory banks and one of the memory banks is shown in FIG. 1. Referring to FIG. 1, the memory device includes a memory array 110 which includes a plurality of memory cells, a row circuit 120 for activating a word line selected by a row address R_ADD, and a column circuit 130 for accessing (reading or writing) data DATA of a bit line selected by a column address C_ADD.

A row fuse circuit 140 stores a row address corresponding to a defective memory cell in the memory array 110, as a repair row address REPAIR_R_ADD. A row repair circuit 150 compares the repair row address REPAIR_R_ADD stored in the row fuse circuit 140 and the row address R_ADD inputted from an exterior of the memory device. If the repair row address REPAIR_R_ADD and the row address R_ADD correspond to each other, the row repair circuit 150 controls the row circuit 120 to activate a redundancy word line instead of a word line designated by the row address R_ADD. That is to say, row (word line) corresponding to the repair row address REPAIR_R_ADD stored in the row fuse circuit 140 is replaced with a redundancy row (word line).

In the drawing, the reference symbol TACT denotes an active command for commanding the activation of a word line, and the reference symbol IPRE denotes a precharge command for commanding the deactivation of an activated word line. The reference symbols IRIS and IT denote a read command and a write command, respectively.

In the conventional row fuse circuit 140, laser fuses are generally included and used. Laser fuses store high or low logic level of data depending on whether the laser fuses are cut or not. Although the laser fuses may be programmed in a wafer level of a memory device, it is not possible to program the laser fuses after a wafer is mounted in a package. Also, it is difficult to design the laser fuses in a below a certain size, due to a limitation in decreasing the pitch length thereof.

In order to alleviate such issues, a nonvolatile memory such as an E-fuse array circuit, a NAND flash memory, a NOR flash memory, an MRAM (magnetoresistive random access memory), an STT-MRAM (spin transfer torque magnetoresistive random access memory), an ReRAM (resistive random access memory) and a PC RAM (phase change random access memory) as disclosed in U.S. Pat. Nos. 6,940,751, 6,777,757, 6,667,902, 7,173,851 and 7269047 is included in a memory device, and repair information (repair addresses) is stored in the nonvolatile memory, for use.

FIG. 2 is a diagram showing the use of a nonvolatile memory circuit to store repair information in a memory device.

Referring to FIG. 2, the memory device includes a plurality of memory banks BK0 and BK1, registers 210_0 and 210_1 which are provided in the respective memory banks BK0 and BK1 to store repair information, and a nonvolatile memory circuit 201.

The nonvolatile memory circuit 201 is a substitution circuit for the row fuse circuit 140 shown in FIG. 1. Repair information, that is, repair addresses, corresponding to all the banks BK0 and BK1 is stored in the nonvolatile memory circuit 201. The nonvolatile memory circuit 201 includes regions REGION0 and REGION1. Repair information corresponding to the memory bank BK0 is stored in the region REGION0, and repair information corresponding to the memory bank BK1 is stored in the region REGION1. The nonvolatile memory circuit 201 may be any nonvolatile memo such as an E-fuse array circuit, a NAND flash memory, a NOR flash memory, an MRAM (magnetoresistive random access memory), an STT-MRM (spin transfer torque magnetoresistive random access memory), a ReRAM (resistive random access memory) and a PC RAM (phase change random access memory).

The registers 210_0 and 210_1 are provided in the respective memory banks BK0 and BK1 and store repair information of the respective memory banks BK0 and BK1. The register 210_0 stores to the repair information of the memory bank BK0, and the register 210_1 stores the repair information of the memory bank BK1. The registers 210_0 and 210_1 may include latch circuits, and may store the repair information only while power is supplied. The register 210_0 receives the repair information stored in the region REGION0 of the nonvolatile memory circuit 201, and the register 210_1 receives the repair information stored in the region REGION1 of the nonvolatile memory circuit 201.

The repair information stored in the nonvolatile memory circuit 201 is transmitted to and stored in the registers 210_0 and 210_1 to be used for a repair operation. Since the nonvolatile memory circuit 201 is configured in an array, a predetermined time is required to call the data stored in the nonvolatile memory circuit 201. Because the memory device cannot make an immediate call for the data stored in the nonvolatile memory circuit 201, it is impossible to perform a repair operation by directly using the data stored in the nonvolatile memory circuit 201. Therefore, a boot-up operation, in which the repair information stored in the nonvolatile memory circuit 201 is transmitted to and stored in the registers 210_0 and 210_1, is performed, and a repair operation is performed using the repair information stored in the registers 210_0 and 210_1, after the boot-up operation is performed.

In order to program (write) the repair information repair addresses) in the nonvolatile memory circuit 201, a test is to be to performed for the memory banks BK0 and BK1 and a repair address is to be detected as a result of the test. As the test for the memory banks BK0 and BK1, a parallel test (or a compression test) is generally used. The parallel test is performed such that the same data is written in a plurality of memory cells, data is read from the memory cells written with the data, and a determination of pass is made when all the same data is read from the memory cells and as a fail when even one different datum is read from the memory cells. For example, after the same data of '0' is written in memory cells corresponding to a $100^{th}$ row (word line) of the memory bank BK0 and then a read operation is performed, the $100^{th}$ row of the memory bank BK0 may be determined to be a pass row when data of '0' are read from the memory cells and to be a fail row when data of '1' is read from even one of the memory cells.

While such a parallel (compression) test may be performed for one memory bank as in the above-described example, the parallel (compression) test may be performed simultaneously for at least two memory banks BK0 and BK1. For example, after the same data of '0' is written in memory cells corresponding to $100^{th}$ rows of the memory banks BK0 and BK1 and then a read operation is performed, the $100^{th}$ rows of the memory banks BK0 and BK1 may be determined to be a pass row when data of '0' are read from the memory cells and to be a fail row when data of '1' is read from even one of the memory cells. In this case, when a fail row, that is, a defective row, is detected, it is impossible to know whether the fail row exists in the memory bank BK0, in the memory bank BK1 or in both the memory banks BK0 and BK1.

In the case where a parallel' test is performed for one memory bank, if a fail row is detected, an address corresponding to the detected fail row may be programmed in a corresponding region of the regions REGION0 and REGION1 of the nonvolatile memory circuit 201. For example, if a $50^{th}$ row is determined to be a fail row as a result of performing a parallel test for the memory bank BK1, a repair address corresponding to the $50^{th}$ row may be programmed in the region REGION1 of the nonvolatile memory circuit 201. However, in the case where a parallel test is performed simultaneously for the two memory banks BK0 and BK1, if a fail row is detected, an address corresponding to the detected fail row may be programmed in both the regions REGION0 and REGION1 of the nonvolatile memory circuit 201. For example, if $30^{th}$ rows are determined to be a fail row as a result of performing a parallel test for the memory banks BK0 and BK1, a program operation is to be performed twice in such a way as to program a repair address corresponding to the $30^{th}$ row in the region REGION0 of the nonvolatile memory circuit 201, and program a repair address corresponding to the $30^{th}$ row in the region REGION1 of the nonvolatile memory circuit 201.

SUMMARY

Various embodiments are directed to a technology capable of shortening the time required for programming a repair address in a nonvolatile memory circuit.

In an embodiment, a memory device may include a first memory block including a plurality of first memory cells, a second memory block including a plurality of second memory cells, a reception circuit suitable for receiving a repair address and compression information, and a nonvolatile memory circuit including a first region for repairing the first memory block and a second region for repairing the second memory block, and suitable for programming the repair address in both the first region and the second region when the compression information represents high compression and programming the repair address in either the first region or the second region when the compression information represents low compression.

The compression information may represent the high compression when the repair address is generated by testing together the first memory block and the second memory block, and the compression information may represent the low compression when the repair address is generated by testing separately the first memory block and the second memory block.

The memory device may further include a first register suitable for receiving and storing a first repair address stored in the first region, in a boot-up operation; and a second register suitable for receiving and storing a second repair address stored in the second region, in the boot-up operation.

In an embodiment, a memory device may include a plurality of memory blocks, a reception circuit suitable for receiving a repair address and compression information, and a nonvolatile memory circuit including a plurality of regions respectively corresponding to the plurality of memory blocks, and suitable for programming the repair address in at least two regions among the plurality of regions when the compression information represents high compression and programming ing the repair address in one region among the plurality of regions when the compression information represents compression.

The compression information may represent the high compression when the repair address is generated by testing the at least two memory blocks among the plurality of memory blocks, and the compression information may represents the low compression when the repair address is generated by testing one memory block among the plurality of memory blocks.

The memory device may further include a plurality of registers corresponding to the respective memory blocks and the respective regions, and suitable for receiving and storing respective repair addresses stored in the regions, in a boot-up operation.

DETAILED DESCRIPTION

Figure 1:
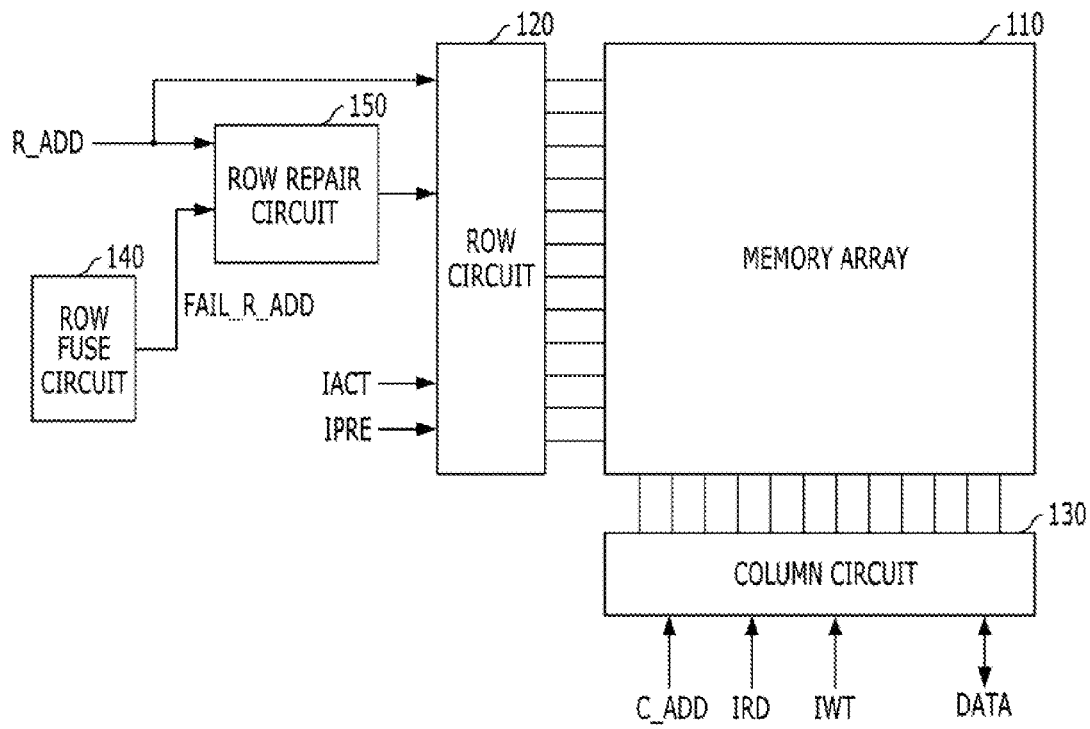
FIG. 1 is a diagram explaining a repair operation in a conventional memory device (for example, a DRAM).
Figure 2:
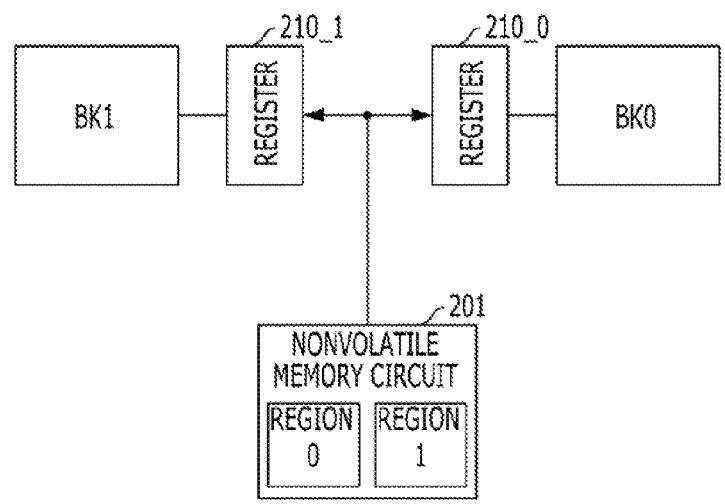
FIG. 2 is a diagram showing the use of a nonvolatile memory circuit to store repair information in a memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings, thickness and length of components are exaggerated for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification a singular form may include a plural form as long as it is not specifically mentioned. Furthermore, 'include/comprise' or 'including/comprising' used in the specification represents that one or more components, steps, operations, and elements exist or are added.

Figure 3:
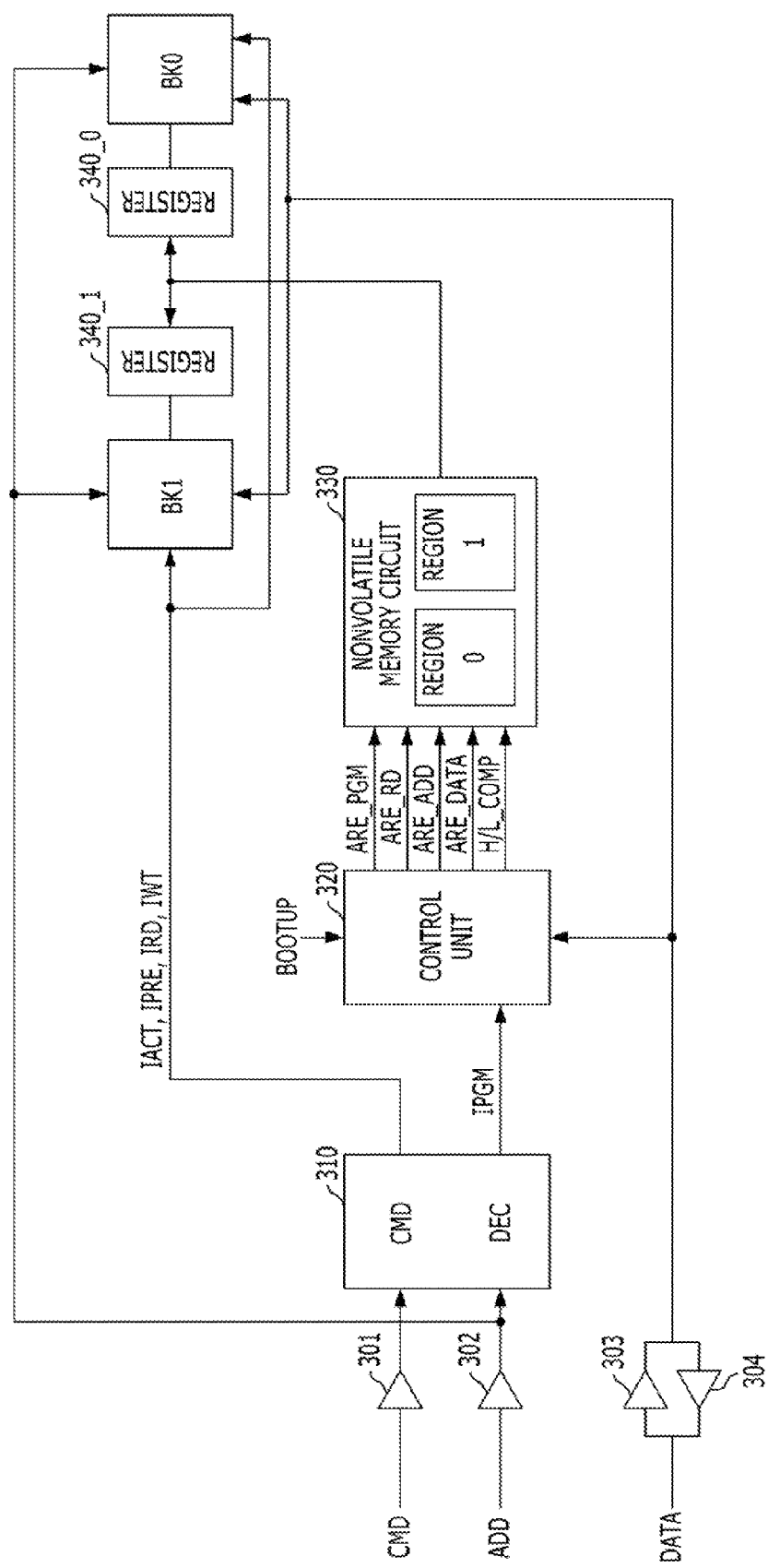
FIG. 3 is a configuration diagram of a memory device in accordance with an embodiment.

FIG. 3 is a configuration diagram of a memory device in accordance with an embodiment.

Referring to FIG. 3, the memory device may include a command reception unit 301, an address reception unit 302, a data reception unit 303, a data transmission unit 304, a command decoder 310, a control unit 320, a nonvolatile memory circuit 330, registers 340_0 and 340_1, and memory blocks BK0 and BK1. The terms of the command reception unit 301, the address reception unit 302, the data reception unit 303 and the data transmission unit 304 are defined based on the memory blocks BK0 and BK1. For example, although data to be stored in the memory blocks BK0 and BK1 may be inputted through the data reception unit 303, an address may be inputted through the data reception unit 303 with respect to the nonvolatile memory circuit 330.

The command reception unit 301 may receive a command CMD which is inputted from an exterior of the memory device. The command CMD may include a chip select signal (CS), an active signal (ACT), a row address strobe signal (RAS), a column address strobe signal CAS), and a write enable signal (WE).

The address reception unit 302 may receive an address ADD which is inputted from an exterior of the memory device and includes multiple bits. A row address for selecting a row and a column address for selecting a column are inputted through the same pad. The address ADD inputted in synchronization with the row address strobe signal (RAS) may be recognized as a row address by the memory device, and the address ADD inputted in synchronization with the column address strobe signal (CAS) may be recognized as a column address by the memory device.

The data reception unit 303 may receive multi-bit data DATA which is inputted from an exterior of the memory device, and the data transmission unit 304 may output data to an exterior of the memory device. Data to be written in the memory blocks BK0 and BK1 may be received through the data reception unit 303, and the data read from the memory blocks BK0 and BK1 may be outputted through the data transmission unit 304.

The command decoder 310 may decode the command CMD which is received through the command reception unit 301, and may generate various internal commands. When the command decoder 310 generates the internal commands, not only the command CMD received through the command reception unit 301 but also a part of the address ADD inputted through the address reception unit 302 may be used. The internal commands generated by the command decoder 310 may include an internal active command IACT, an internal precharge command IPRE, an internal read command IRD, and an internal write command IWT. Meanwhile, the command decoder 310 may generate an internal program command IPGM as an internal command which is associated with the nonvolatile memory circuit 330. The internal program command IPGM may be an internal command for programming (writing) repair information in the nonvolatile memory circuit 330.

The memory blocks BK0 and BK1 may perform an active operation, a precharge operation, and operations for reading and writing data, according to instructions of the command decoder 310. The data inputted through the data reception unit 303 from the exterior of the memory device may be written in the memory blocks BK0 and BK1 in the write operation, and the data read from the memory blocks BK0 and BK1 may be outputted through the data transmission unit 304 to the exterior of the memory device in the read operation. A memory block and memory cells in the memory block, which are to be accessed in the read and write operations, may be selected by the address ADD. The memory block BK0 may be to repaired using the repair addresses stored in the register 340_0, and the memory block BK1 may be repaired using the repair addresses stored in the register 340_1.

The nonvolatile memory circuit 330 may store information (that is, repair addresses) for repairing the memory blocks BK0 and BK1. Regions REGION0 and REGION1 are included in the nonvolatile memory circuit 330. The region REGION0 may be a region for the memory block BK0, and the region REGION1 may be a region for the memory block BK1. A process of transmitting and storing the information stored in the nonvolatile memory circuit 330 to the registers 340_0 and 340_1 is referred to as a boot-up operation. In the boot-up operation, the information stored in the region REGION0 may be transmitted to and stored in the register 340_0, and the information stored in the region REGION1 may be transmitted to and stored in the register 340_1. The reason why the information stored in the nonvolatile memory circuit 330 is transmitted to and stored in the registers 340_0 and 340_1 to be used is as follows. Since the nonvolatile memory circuit 330 is configured in an array, a predetermined time is required to call the data stored in the nonvolatile memory circuit 330. However, the repair information stored in the nonvolatile memory circuit 330 is information which needs to be immediately used. Therefore, the boot-up operation in which the repair information stored in the nonvolatile memory circuit 330 is transmitted to the registers 340_0 and 340_1 is performed, and the repair information stored in the registers 340_0 and 340_1 is used by the memory blocks BK0 and BK1 after the boot-up operation is performed. The nonvolatile memory circuit 330 may be one of nonvolatile memories such as an E-fuse array circuit, a NAND flash memory, a NOR flash memory, an MRAM (magnetoresistive random access memory), an STT-MRAM (spin transfer torque magnetoresistive random access memory), an ReRAM (resistive random access memory) and a PC RAM (phase change random access memory) as disclosed in U.S. Pat. Nos. 6,940,751, 6,777,757, 6,667,902, 7,173,851 and 7,2690,47.

The main functions of the memory device are write operations for writing the data inputted from the exterior of the memory device and read operations for providing stored data to the exterior of the memory device. Thus, while the capacities of the memory blocks BK0 and BK1 which perform the read and write operations may be relatively large, the capacity of the nonvolatile memory circuit 330 for storing information to be used in the memory blocks BK0 and BK1 may be relatively small. For example, while data of several gigabits may be stored in the memory blocks BK0 and BK1, data of several tens of megabits may be stored in the nonvolatile memory circuit 330.

The control unit 320 may control the program operation of the nonvolatile memory circuit 330, and the boot-up operation in which the data stored in the nonvolatile memory circuit 330 is booted up to the registers 340_0 and 340_1.

If the internal program command IPGM is activated, the control unit 320 activates a program signal ARE_PGM for programming the nonvolatile memory circuit 330, and applies an address ARE_ADD, data ARE_DATA and compression information H/L_COMP to the nonvolatile memory circuit 330. The address ARE_ADD, the data ARE_DATA and the compression information H/L_COMP which are to be applied to the nonvolatile memory circuit 330, may be received through the data reception unit 303. Since the nonvolatile memory circuit 330 has a relatively small capacity, all of the address ARE_ADD, the data ARE_DATA and the compression information H/L_COMP may be received through the data reception unit 303. The control unit 320 may classify the signals received through the data reception unit 303, as the address ARE_ADD, the data ARE_DATA and the compression information H/L_COMP. For example, if a 24-bit signal is received through the data reception unit 303, 8 bits may be classified as the address ARE_ADD and 12 bits may be classified as the data ARE_DATA, and 1 bit may be classified as the compression information H/L_COMP. They may be transmitted to the nonvolatile memory circuit 330, and the remaining 3 bits may be classified as reserved signals for an address and data. While it was illustrated in the embodiment that the address ARE_ADD, the data ARE_DATA and the compression information H/L_COMP are received through the data reception unit 303, it is to be noted as a matter of course that they may be received through a reception circuit (for example, the command reception unit 301 or the address reception unit 302) other than the data reception unit 303.

In the boot-up operation in which a boot-up signal BOOTUP is activated, the control unit 320 may control the nonvolatile memory circuit 330 in such a manner that all the information stored in the nonvolatile memory circuit 330 may be transmitted to the registers 340_0 and 340_1. The control unit 320 may cyclically activate a read signal ARE_RD which causes the nonvolatile memory circuit 330 to perform the read operation, and may change the address ARE_ADD each time the read signal ARE_RD is activated, such that all data in the nonvolatile memory circuit 330 may be read. The boot-up operation may be performed during the initialization period of the memory device. An address, which is not received through the data reception unit 303 but generated through a counting scheme inside the control unit 320, may be applied to the nonvolatile memory circuit 330 in the boot-up operation.

The program operation of the nonvolatile memory circuit 330 is performed differently when the compression information H/L_COMP has a logic high level and a logic low level. This will be described below.

(1) The program operation of the nonvolatile memory circuit 330 in the case where the compression information H/L_COMP has a logic low level.

The fact that the compression information H/L_COMP has a to logic low level may mean that a repair address, that is, the data ARE_DATA to be programmed in the nonvolatile memory circuit 330, is generated through a test of a low compression mode. The test of a low compression mode means that tests for the memory block BK0 and the memory block BK1 are performed separately from each other. In this case, the data ARE_DATA is programmed at a position which is designated by the address ARE_ADD in the nonvolatile memory circuit 330. By the address ARE_ADD, one of the regions REGION0 and REGION1 may be selected, and it may select which position in a selected region the data ARE_DATA is to be programmed at. Since different data may be programmed to the region REGION0 and the REGION1 through the program operation of such a scheme, resultantly, the memory block BK0 and the memory block BK1 may be repaired separately from each other. For example, a $3^{rd}$ row may be repaired in the memory block BK0, and a $5^{th}$ row may be repaired in the memory block BK1, (2) The program operation of the nonvolatile memory circuit 330 in the case where the compression information H/L_COMP has a logic high level.

The fact that the compression information H/L_COMP has a logic high level may mean that a repair address, that is, the data ARE_DATA to be programmed in the nonvolatile memory circuit 330 is generated through a test of a high compression mode. The test of a high compression mode means that tests for the memory block BK0 and the memory block BK1 are performed simultaneously with each other. In this case, even when a fail row is detected, it is impossible to determine whether the fail row actually exists in the memory block BK0 or the memory block BK1. In this case, the data ARE_DATA may be programmed duplicately in the region REGION0 and the region REGION1 of the nonvolatile memory circuit 330. The address ARE_ADD is used only to designate positions where the data ARE_DATA is to be programmed in the regions REGION0 and REGION1, and is not used to distinguish the regions REGION0 and REGION1 from each other. In other words, among the multi-bit signals which configure the address ARE_ADD, signals for distinguishing the region REGION0 and the region REGION1 are neglected. Since the same data ARE_DATA is programmed in the region REGION0 and the region REGION1 through the program operation of such a scheme, resultantly, the memory block BK0 and the memory block BK1 may be repaired in the same manner. For example, if a $100^{th}$ row is repaired in the memory block BK0, a $100^{th}$ row may be repaired in the memory block BK1 as well.

In the case where a repair address is detected through the test of a high compression mode, it is meaningless to distinguish the memory blocks BK0 and BK1 in association with the repair operation. Accordingly, the same data ARE_DATA is to be programmed in the region REGION0 and the region REGION1. In this regard, in the present embodiment, since the data ARE_DATA is duplicately programmed in the regions REGION0 and REGION1 when the compression information H/L_COMP has the logic high level, the same data need not be programmed twice, and as a result, the time required for programming the nonvolatile memory circuit 330 may be shortened.

While it was described in the embodiment that each of the memory blocks BK0 and BK1, which is a basic unit for test and repair operations, is a memory bank, it is to be noted that each of the memory blocks BK0 and BK1 may be a unit (for example, a group of memory banks) larger than a memory bank or a unit (for example, one of sections included in a memory bank) smaller than a memory bank. Also, the regions REGION0 and REGION1 in the nonvolatile memory circuit 330 are only to be distinguished based on which registers 340_0 and 340_1 the data stored therein is to be transmitted to in the boot-up operation, and the regions REGION0 and REGION1 may not be physically separated from each other.

Figure 4:
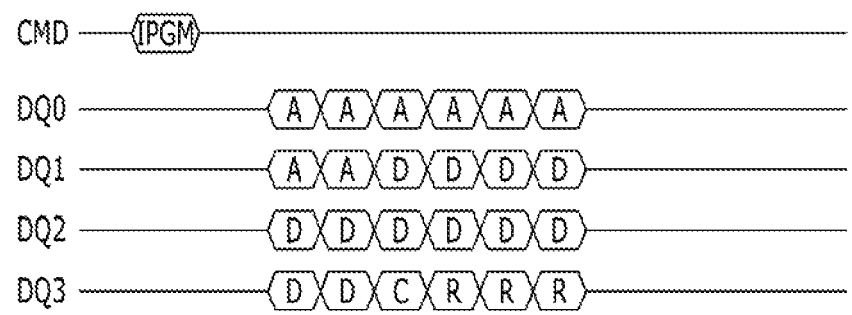
FIG. 4 is a diagram showing a process in which an address ARE_ADD, data ARE_DATA and compression information H/L_COMP to be used in a nonvolatile memory circuit 330 are received through a data reception unit 303.

FIG. 4 is a diagram showing a process in which the address ARE_ADD, the data ARE_DATA and the compression information H/L_COMP to be used in the nonvolatile memory circuit 330 are received through the data reception unit 303.

Referring to FIG. 4, after the internal program command IPGM is activated by the command decoder 310, the data reception unit 303 may receive 24-bit signals for the nonvolatile memory circuit 330 through 4 data pads DQ0 to DQ3. The signals designated by the symbol A may be 8-bit signals which configure the address ARE_ADD, and the signals designated by the symbol D may be 12-bit signals which configure the data ARE_DATA. Further, the signal designated by the symbol C may represent the compression information H/L_COMP. The signals designated by the symbol R may be reserved signals to be ready for an increase in the bit numbers of the address ARE_ADD and the data ARE_DATA.

Figure 5:
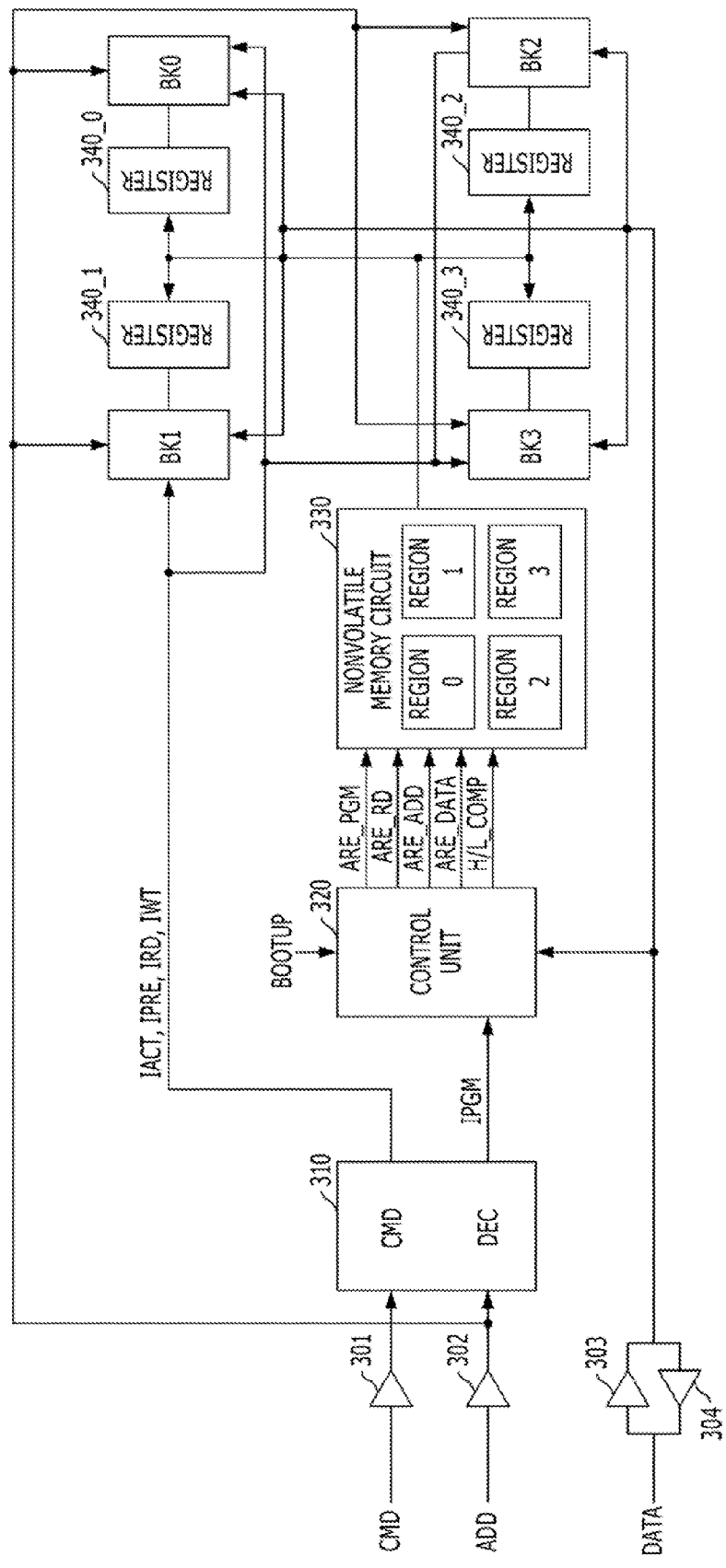
FIG. 5 is a configuration diagram of a memory device in accordance with another embodiment.

FIG. 5 is a configuration diagram of a memory device in accordance with another embodiment.

Referring to FIG. 5, the memory device may include a command reception unit 301, an address reception unit 302, a data reception unit 303, a data transmission unit 304, a command decoder 310, a control unit 320, a nonvolatile memory circuit 330, registers 340_0, 340_1, 340_2 and 340_3, and memory blocks BK0, BK1, BK2 and BK3. FIG. 5 shows an embodiment in which the number of memory blocks BK0, BK1, BK2 and BK3 increases to 4 and accordingly the numbers of registers 340_0, 340_1, 340_2 and 340_3 and regions REGION0, REGION1, REGION2 and REGION3 increase to 4.

Among the regions REGION0, REGION1, REGION2 and REGION3, the registers 340_0, 340_1, 340_2 and 340_3, and the memory blocks BK0, BK1, BK2 and BK3, those that are numbered the same may correspond to one another. The data stored in the regions REGION0, REGION1, REGION2 and REGION3 may be transmitted to and stored in the respective registers 340_0, 340_1, 340_2 and 340_3, and the memory blocks BK0, BK1, BK2 and BK3 may be repaired using the information stored in the respective registers 340_0, 340_1, 340_2 and 340_3.

In a high compression test, the memory blocks BK0 and BK1 may be tested together, and the memory blocks BK2 and BK3 may be tested together. Therefore, in a program operation of the nonvolatile memory circuit 330, in the case where compression information H/L_COMP has a logic high level, data ARE_DATA may be duplicately programmed in the regions REGION0 and REGION1 and data ARE_DATA may be duplicately programmed in the regions REGION2 and REGION3. Of course, in the case where compression information H/L_COMP has a logic low level, data ARE_DATA may be programmed in one region of the regions REGION0, REGION1, REGION2 and REGION3.

As is apparent from the above descriptions, according to the embodiments, if compression information represents high compression, an inputted repair address may be programmed in at least two regions in a nonvolatile memory circuit. Accordingly, it is possible to shorten the time for programming the repair address in the nonvolatile memory circuit.

Although various embodiments have been described for illustrative purposes, it will be apparent to those skilled in the art that various changes and modifications ray be made without departing from the spirit and scope of the invention as defined in the following claims.

What is claimed:

1. A memory device comprising:
   a first memory block including a plurality of first memory cells;
   a second memory block including a plurality of second memory cell;
   a reception circuit suitable for receiving a repair address and compression information; and
   a nonvolatile memory circuit including a first region for repairing the first memory block and a second region for repairing the second memory block, and suitable for programming the repair address in both the first region and the second region when the compression information represents high compression and programming the repair address in either the first region or the second region when the compression information represents low compression.

2. The memory device according to claim 1,
   wherein the compression information represents the high compression when the repair address is generated by testing the first memory block and the second memory block together, and
   wherein the compression information represents the low compression when the repair address is generated by testing the first memory block and the second memory block separately.

3. The memory device according to claim further comprising:
   a first register suitable for receiving and storing a first repair address stored in the first region, in a boot-up operation; and
   a second register suitable for receiving and storing a second repair address stored in the second region, in the boot-up operation.

4. The memory device according to claim 3,
   wherein, among the first memory cells, a first memory cell corresponding to the first repair address is replaced with a first redundancy memory cell, and
   wherein, among the second memory cells, a second memory cell corresponding to the second repair address is replaced with a second redundancy memory cell.

5. The memory device according to claim 1,
   wherein the reception circuit receives a multi-bit nonvolatile memory address which designates a position where the repair address is to be programmed in the nonvolatile memory circuit, and
   wherein the repair address is programmed in both the first and second regions by using first bits of the nonvolatile memory address, excluding second bits thereof, while the repair address is programmed in either the first or second regions by using the first and second bits thereof.

6. The memory device according to claim 1, wherein the second bits of the nonvolatile memory address designate one of the first and second regions in which the repair address is to be programmed.

7. A memory device comprising:
   a plurality of memory blocks;
   a reception circuit suitable for receiving a repair address and compression information; and
   a nonvolatile memory circuit including a plurality of regions respectively corresponding to the plurality of memory blocks, and suitable for programming the repair address in at least two regions among the plurality of regions when the compression information represents high compression and programming the repair address in one region among the plurality of regions when the compression information represents low compression.

8. The memory device according to claim 7,
   wherein the compression information represents the high compression when the repair address is generated by testing the at least two memory blocks among the plurality of memory blocks, and
   wherein the compression information represents the low compression when the repair address is generated by testing one memory block among the plurality of memory blocks.

9. The memory device according to claim fu comprising:
   a plurality of registers corresponding to the respective memory blocks and the respective regions, and suitable for receiving and storing respective repair addresses stored in the regions, in a boot-up operation.

10. The memory device according to claim 9, wherein the plurality of memory blocks each replaces a memory cell, corresponding to a repair address stored in a corresponding register, with a redundancy memory cell.

11. The memory device according to claim 7,
    wherein the reception circuit receives a multi-bit nonvolatile memory address which designates a position where the repair address is to be programmed in the nonvolatile memory circuit, and
    wherein the repair address is programmed in the at least two regions by using first bits of the nonvolatile memory address, excluding second bits thereof, while the repair address is programmed in the one region by using the first and second bits thereof.

12. The memory device according to claim 11, wherein the second bits of the nonvolatile memory address designate one of the plurality of regions in which the repair address is to be programmed.

* * * * *